(12) United States Patent
Ewanchuk et al.

(10) Patent No.: US 11,114,349 B2
(45) Date of Patent: Sep. 7, 2021

(54) SYSTEM AND METHOD FOR ALLOWING RESTORATION OF FIRST INTERCONNECTION OF DIE OF POWER MODULE

(71) Applicant: MITSUBISHI ELECTRIC CORPORATION, Tokyo (JP)

(72) Inventors: Jeffrey Ewanchuk, Rennes (FR); Julio Brandelero, Rennes (FR); Stefan Mollov, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/755,412

(22) PCT Filed: Oct. 31, 2018

(86) PCT No.: PCT/JP2018/041258
§ 371 (c)(1),
(2) Date: Apr. 10, 2020

(87) PCT Pub. No.: WO2019/107095
PCT Pub. Date: Jun. 6, 2019

(65) Prior Publication Data
US 2020/0286797 A1    Sep. 10, 2020

(30) Foreign Application Priority Data
Nov. 28, 2017 (EP) .................... 17204198

(51) Int. Cl.
*H01L 21/00* (2006.01)
*H01L 21/66* (2006.01)
(Continued)

(52) U.S. Cl.
CPC .......... *H01L 22/22* (2013.01); *H01L 23/3735* (2013.01); *H01L 24/20* (2013.01);
(Continued)

(58) Field of Classification Search
CPC ..... H01L 22/22; H01L 23/3735; H01L 24/20; H01L 24/45; H01L 2924/19104;
(Continued)

(56) References Cited

U.S. PATENT DOCUMENTS 5,721,455 A * 2/1998 Takashita ................. H01L 23/34
257/177
7,148,504 B2 * 12/2006 Yamada .................. H01L 23/62
257/48

(Continued)

OTHER PUBLICATIONS

International Search Report (PCT/ISA/210) dated in PCT/JP2018/041258, dated Jan. 25, 2019.
(Continued)

*Primary Examiner* — Luan C Thai
(74) *Attorney, Agent, or Firm* — Birch, Stewart, Kolasch & Birch, LLP (57) ABSTRACT

The present invention concerns a system for allowing the restoration of a first interconnection of a die of a power module connecting the die to an electric circuit. The system comprises: at least one other interconnection of the power module, a periodic current source that is connected to the at least one other interconnection for generating a periodic current flow through the at least one other interconnection in order to reach, in at least a part of the first interconnection, a predetermined temperature during a predetermined time duration. The present invention concerns also the associated method.

10 Claims, 5 Drawing Sheets

(51) Int. Cl.
*H01L 23/373* (2006.01)
*H01L 23/00* (2006.01)

(52) U.S. Cl.
CPC ........ *H01L 24/45* (2013.01); *H01L 2224/215* (2013.01); *H01L 2224/45124* (2013.01); *H01L 2924/19042* (2013.01); *H01L 2924/19104* (2013.01); *H01L 2924/3512* (2013.01)

(58) Field of Classification Search
CPC ... H01L 2924/3512; H01L 2924/19042; H01L 2224/45124; H01L 2224/215
USPC .......................................................... 438/4
See application file for complete search history.

(56) References Cited

U.S. PATENT DOCUMENTS

| | | | |
|---|---|---|---|
| 7,928,587 B2 * | 4/2011 | Tamba | H01L 24/49 257/784 |
| 9,508,700 B2 * | 11/2016 | Komo | H01L 24/33 |
| 2005/0236617 A1 | 10/2005 | Yamada | |
| 2016/0233202 A1 | 8/2016 | Komo et al. | |

OTHER PUBLICATIONS

Written Opinion (PCT/ISA/237) issued in PCT/JP2018/041258, dated Jan. 29, 2019.

* cited by examiner

SYSTEM AND METHOD FOR ALLOWING RESTORATION OF FIRST INTERCONNECTION OF DIE OF POWER MODULE

TECHNICAL FIELD

The present invention relates generally to a device and a method and a system for allowing the restoration of an interconnection of a die of a power module.

BACKGROUND ART

Power modules installed in applications experience wear out due to the fact that they are composed of a variety of layered materials, each with different properties.

Power modules have to support large temperature excursions during operation. The wear out inherent to the operation manifests as an increasing crack in various interface layers such as the solder layer or the bond wires.

In order to combat wear out, power modules are designed with better matched materials, but this solution often suffers from poor electrical performance and higher manufacturing costs. Furthermore, due to these additional manufacturing costs, it is not practical to design a power module to accommodate the most severe usage scenarios, leading to more stressful applications having lower power module lifetimes.

Typically, after a wear out failure has occurred, the power module is replaced requiring down time in the mission and added cost due to the necessary replacement of the power module. In many applications, the cost of the down time and intervention and unpredictability of the power module failure is significant and can eliminate the benefit of using power electronics cost-wise entirely.

The weak point of power modules are the top side interconnections, which are subject to micro-structure cracks in the aluminium bond wires and/or the copper interconnections.

SUMMARY OF INVENTION

The present invention aims to allow the restoration of at least one interconnection of a die of a power module.

To that end, the present invention concerns a system for allowing the restoration of a first interconnection of a die of a power module connecting the die to an electric circuit, characterized in that the system comprises:

at least one other interconnection of the power module,
a periodic current source that is connected to the at least one other interconnection for generating a periodic current flow through the at least one other interconnection in order to reach, in at least a part of the first interconnection, a predetermined temperature during a predetermined time duration.

The present invention concerns also a method for allowing the restoration of a first interconnection of a die of a power module connecting the die to an electric circuit, characterized in that the method comprises the steps of:

providing a periodic current source to at least one other interconnection of the power module for generating a periodic current flow through the at least one other interconnection in order to reach, in at least a part of the first interconnection, a predetermined temperature,
controlling the periodic current flow at the predetermined temperature during a predetermined time duration.

Thus, the health of the power module is able to be restored by a simple intervention.

In particular, micro-structure cracks in interconnections are targeted by the injection of high frequency current in order not only to increase the interconnection temperature, but also increase the pressure along these cracks and thereby increasing the rate of diffusion in this area. The diffusion causes the crack to heal, and therefore the lifetime of the power module is increased.

According to a particular feature, a first terminal of the first interconnection is connected to the die, a first terminal of the at least one second interconnection is connected to the first terminal of the first interconnection and the periodic current source is connected to the second terminals of the interconnections for generating a periodic current flow through the interconnections.

Thus, a simple and low cost modification of the power module enables the restoration process.

A periodic current is injected without harm to the semi-conductor component. Since this current is short circuited through the top side metallization of the die, the interconnections and the temperatures are kept below the critical silicon temperatures, typically 175° C.

According to a particular feature, the interconnections are bond wires.

Thus, the restoration process can be applied to packages which require flexible and low cost manufacturability.

According to a particular feature, the bond wires are aluminium alloy bond wires.

Thus, the restoration process is applicable to standard alloys found in state of the art power module packages.

According to a particular feature, the periodic current source is a square wave or sinusoidal signal of a frequency upper than 100 KHz and an RMS value of 82 A to 108 Amperes.

Thus, the current source injection can be developed from standard power electronic converter technologies.

According to a particular feature, the predetermined temperature is between 150 to 200° C. and the predetermined time duration is between 50 to 100 hours.

Thus, the restoration process can be performed during a small window of converter downtime for maintenance.

According to a particular feature, the interconnections are copper vias, the periodic current source is connected to two other interconnections and the power module further comprises one induction coil that is connected to the two interconnections in order to reach, in at least a part of the first interconnection, the predetermined temperature during the predetermined time duration.

Thus, the restoration process can be initiated in an embedded package by the application of localized heat without direct contact to the copper vias.

According to a particular feature, the interconnections are copper vias, the periodic current source is connected to two other interconnections and the power module further comprises one magnetic structure that is connected to the two interconnections in order to reach, in at least a part of the first interconnection, the predetermined temperature during the predetermined time duration.

Thus, the restoration process can be initiated in an embedded package by the application of localized heat and an induced current flow without direct contact to the copper vias.

The characteristics of the invention will emerge more clearly from a reading of the following description of example embodiments, the said description being produced with reference to the accompanying drawings.

DESCRIPTION OF EMBODIMENTS

Figure 1:
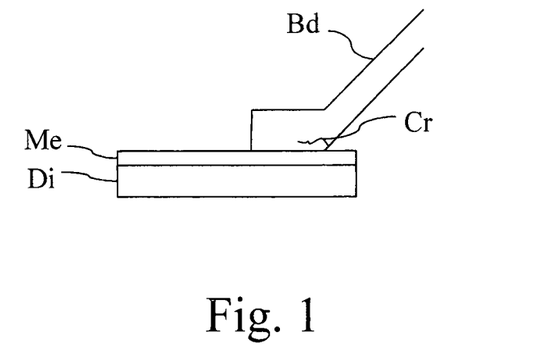
FIG. 1 represents an example of an aluminium bond wire top side interconnection of a power module.

FIG. 1 represents an example of an aluminium bond wire top side interconnection of a power module.

The bond wire Bd is fixed on a Die Di via a metallization layer Me.

Figure 2:
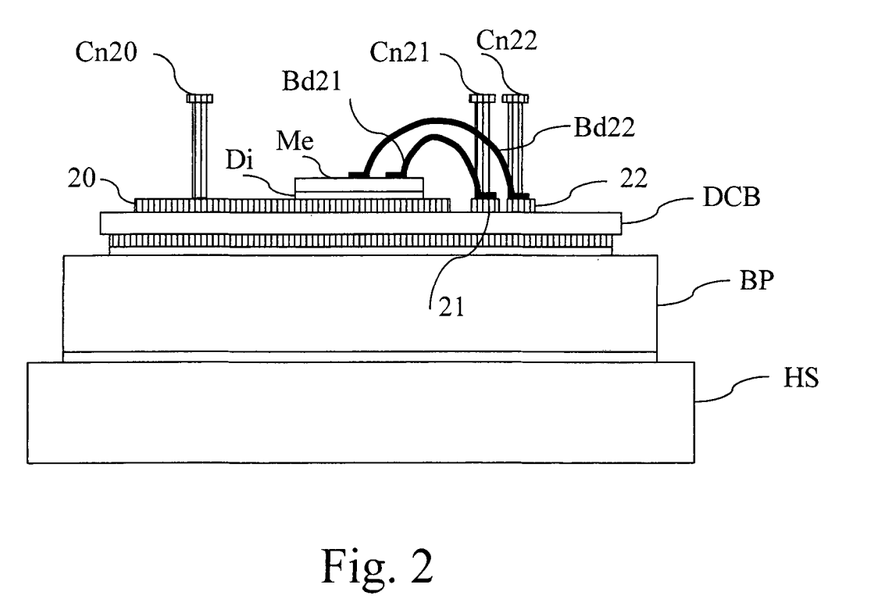
FIG. 2 represents a side view of a power module that has at least a supplementary connection that enables the present invention to be implemented.

The bond wire Bd is subject to a micro-structure crack Cr. FIG. 2 represents a side view of a power module that has at least a supplementary connection that enables the present invention to be implemented.

A classical power module comprises top interconnections Cn20 and Cn21. The interconnections Cn20 and Cn21 are fixed respectively on copper layers 20 and 21 of a Direct copper bonding DCB which is fixed to a base plate BP and a heat sink HS.

The interconnection Cn21 and the copper layer 21 are connected to the die Di by a bond wire Bd21 that may be subject to micro-structure cracks.

According to the invention, the power module further comprises a supplementary interconnection Cn22 that is fixed on a copper layer 22 of the Direct copper bonding DCB. The interconnection Cn22, the copper layer 22 are connected to the die Di by a supplementary bond wire Bd22.

The interconnections Cn21, Cn22, copper layers 21 and 22, bond wires Bd21 and Bd22 form an electric path.

When the interconnections Cn21 and Cn22 are connected to a power source, like for example a high frequency current power source, the current goes through the interconnections Cn21, Cn22, copper layer 21 and 22, bond wires Bd21 and Bd22.

According to the invention, a high frequency current goes through the interconnections Cn21, Cn22, copper layers 21 and 22, bond wires Bd21 and Bd22 at regular intervals to maintain a state of high structure integrity. In particular, micro-structure cracks in the aluminium bond wires are targeted by the injection of high frequency current to not only increase the bond wire temperature, but also increase the pressure along these cracks and thereby increasing the rate of diffusion in this area. The diffusion causes the crack to heal, and therefore the lifetime of the power module is increased.

A high frequency current is injected without harm to the semiconductor component since the high frequency current is short circuited through the top side metallization Me, bond wires, Bd21 and Bd22 and interconnection point Cn21 and Cn22, and the temperatures are kept below the critical Si temperatures, typically 175° C.

Note that the number of additional bond wires should be at least equal to the number of bond wires already present in a classical power module.

As an example of implementation, a die has 6 bond wires, and the injected high frequency current has an RMS value of 82 A to 108 A to keep the current density in each bond wire between 95 A/mm$^2$ and 143 A mm$^2$ to have the peak bond wire temperature at 150 to 200° C. (assuming 35° C. ambient temperature) over a 14 mm bond wire connection.

This high temperature is enough to induce a high diffusion rate necessary for the self-healing property to significantly affect the bond wire microstructure over a period of 50-100 hours i.e. the intervention time. A key component of the self-healing effect is the duration of the thermal stress in the crack and magnitude of the temperature in order to create the high rate of material diffusion.

It has to be noted here that other aluminium alloys can be considered, i.e. Al-Cu, to improve the self-healing characteristics or to have higher rates of self-diffusion.

The high frequency current injection is necessary to further increase the resistance in the bond wire along the edges of the crack due to the skin effect. As an example, for a 400 um aluminium bond wire, a 500 kHz current can be injected, which would correspond to an 115 um skin depth and an increase of four in the losses in the bond wire for the same current magnitude. This current may be composed of a square or sine wave signal of 500 KHz.

Figure 3A:
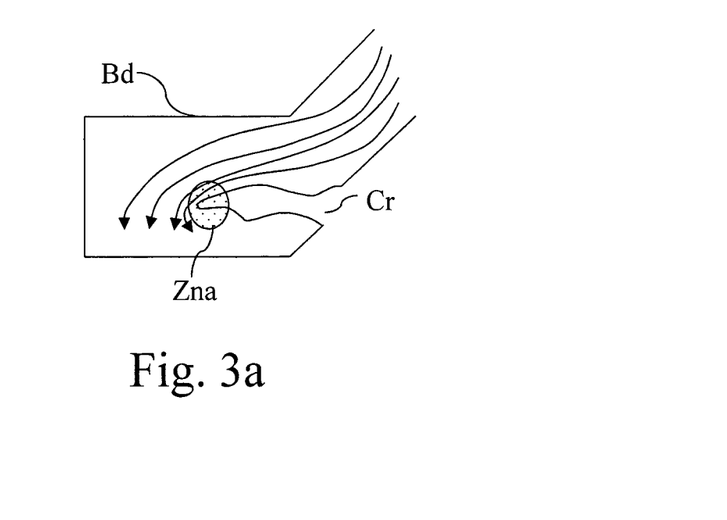
FIG. 3a represents an enlarged view of a crack in a bond wire and pulse current flow in the bond wire.

FIG. 3a represents an enlarged view of a crack in a bond wire and pulse current flow in the bond wire.

In FIG. 3a, arrows represent the high frequency current that flows through the bond wire Bd.

In power module packages, the aluminium (99% Al alloy) bond wires are typically the weakest component, with lift-off of these wires being the most common failure mode. As the bond wire experiences thermal fatigue during normal operation, cracks form within the wire-bond to chip metallization surface interface from outside edge towards the centre. The high frequency injection current is preferably applied when the cracks in the bond wire interface are on the microscopic level i.e. 1-10 um in the bond wire Bd. If the power module is designed for an operational lifetime of 20 years, i.e. by assuming thermomechanical wear out due to thermal cycles, the maintenance intervals may be, for example, in the order of 5 years.

Figure 3B:
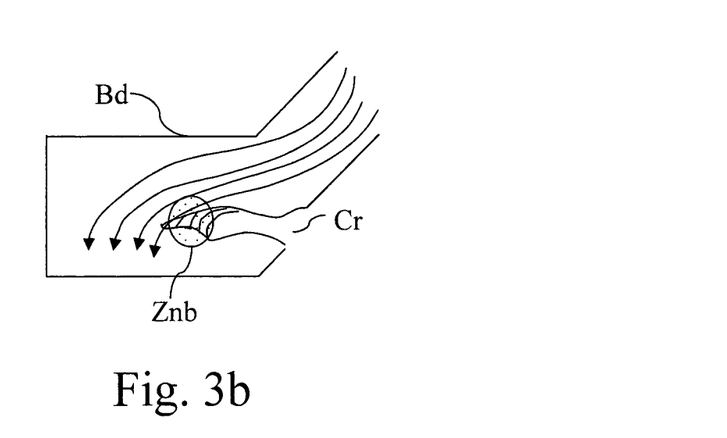
FIG. 3b represents an enlarged view of a crack in a bond wire, pulse current flow in the bond wire and an healing process of the crack according to the present invention.

The high frequency injection current passes through the aluminium bond wire as shown by the arrows. As the crack is a localized point of high resistance, as compared to the rest of the injection circuit, a significant amount of heat is generated at the crack zone Zna in the bond wire. The localized heat causes outwards thermal expansion allowing the sides of the crack to come together under high pressure and high temperature, thereby allowing material diffusion to occur in the crack. After some time under these conditions, the crack will heal, as shown in FIG. 3b and the crack zone Zna in FIG. 3a will move to the crack zone Znb in FIG. 3b.

Figure 4:
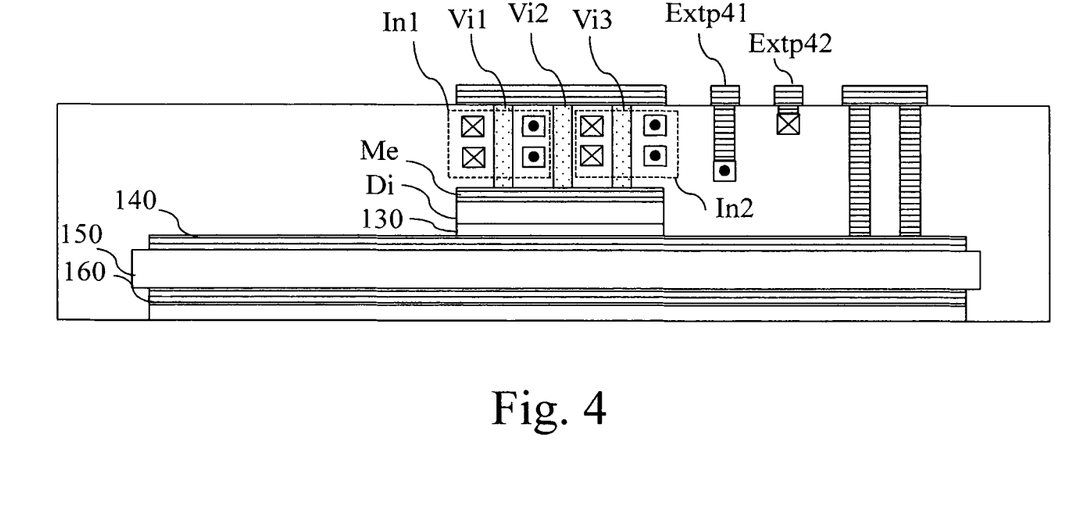
FIG. 4 represents a side view of a power module that has at least a supplementary connection and at least one embedded induction coil that enables the present invention to be implemented.

FIG. 4 represents a side view of a power module that has at least a supplementary connection and at least one embedded induction coil that enables the present invention to be implemented.

The power module, comprises interconnections under the form of via noted Vi1, Vi2 and Vi3, like for example copper layers, that connect a die Di to external components.

The die Di is fixed on a cooper layer 140 of a direct copper bonding (DCB) substrate 140, 150, 160 using a solder 130, the ceramic 150 is fixed on a copper base plate 160 that is fixed on a cold plate.

According to the present invention, the power module further comprises at least for one interconnexion; embedded induction coils In1 and In2 and supplementary interconnections Extp41 and Extp42.

In this manner, a current is injected through interconnections Extp41 and Extp42 to induce heating in each copper via, as the embedded induction coils layers In1 and In2 are placed in such a manner as to replicate a heating coil along each copper via Vi1, Vi2 and Vi3. Typically, as the via length is greater than its width, the placement of these embedded coils is possible, but naturally a trade-off between the number of turns for each via and the stack complexity exists.

Figure 5:
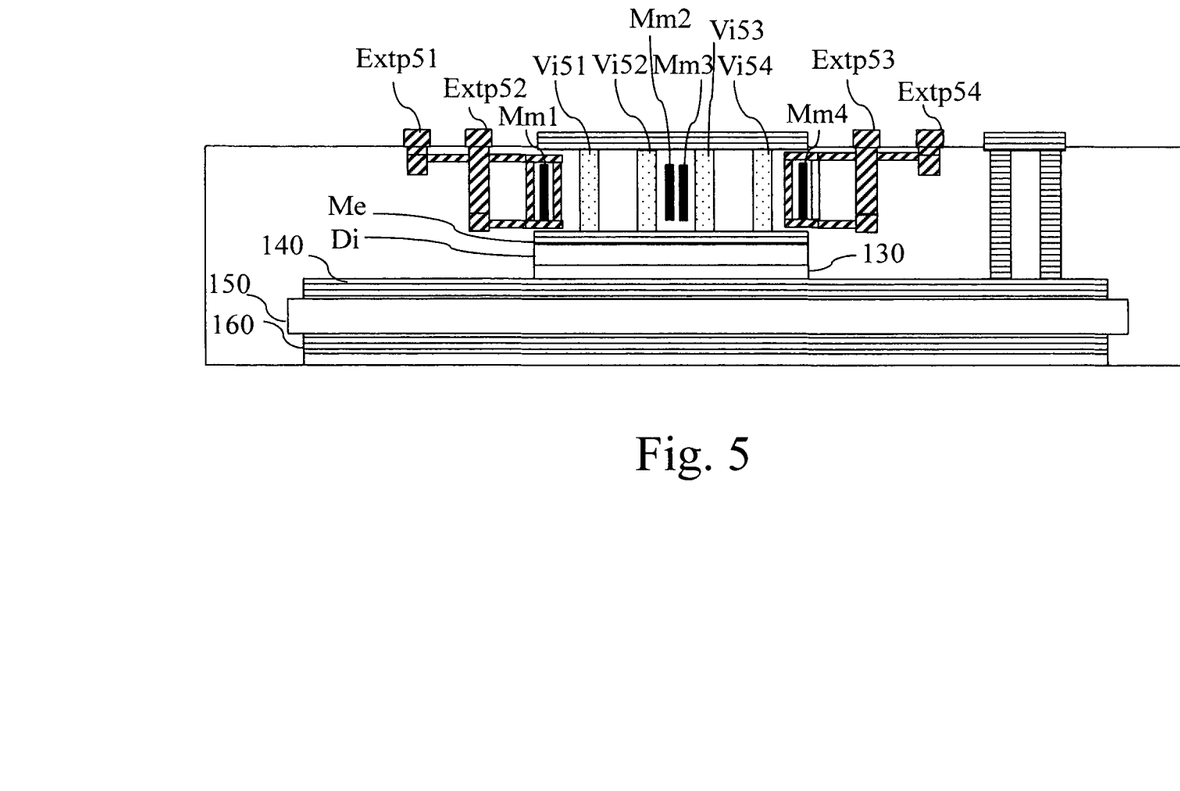
FIG. 5 represents a side view of a power module that has at least a supplementary connection and at least one embedded magnetic structure that enables the present invention to be implemented.

FIG. 5 represents a side view of a power module that has at least a supplementary connection and at least one embedded magnetic structure that enables the present invention to be implemented.

The power module comprises interconnections under the form of via noted Vi51, Vi52 and Vi53, like for example copper layers, that connect a die Di to external components.

The die Di is fixed on a cooper layer 140 of a direct copper bonding (DCB) substrate 140, 150, 160 using a solder 130, the ceramic 150 is fixed on a copper base plate 160 that is fixed on a cold plate.

According to the present invention, the power module further comprises at least for one interconnection, embedded magnetic structures Mm1, Mm2, Mm3 and Mm4. Materials such as Nickel-iron flakes can be embedded within PCB structures. The structure is arranged in a manner as to induce currents to flow from the copper vias through the interconnection surface and the metallization surface in a manner similar to a transformer. The magnetic structures Mm1 and Mm2 form a first transformer and the magnetic structures Mm3 and Mm4 form a second transformer.

Figure 6:
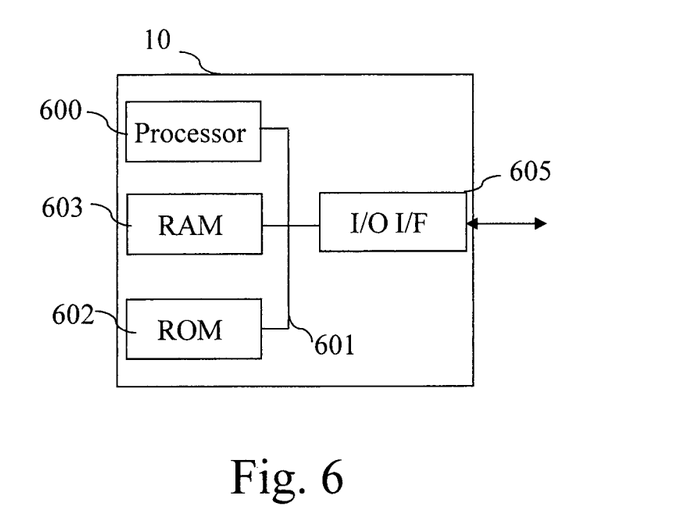
FIG. 6 represents an example of an architecture of a controller according to the present invention.

FIG. 6 represents an example of an architecture of a controller according to the present invention.

Figure 7:
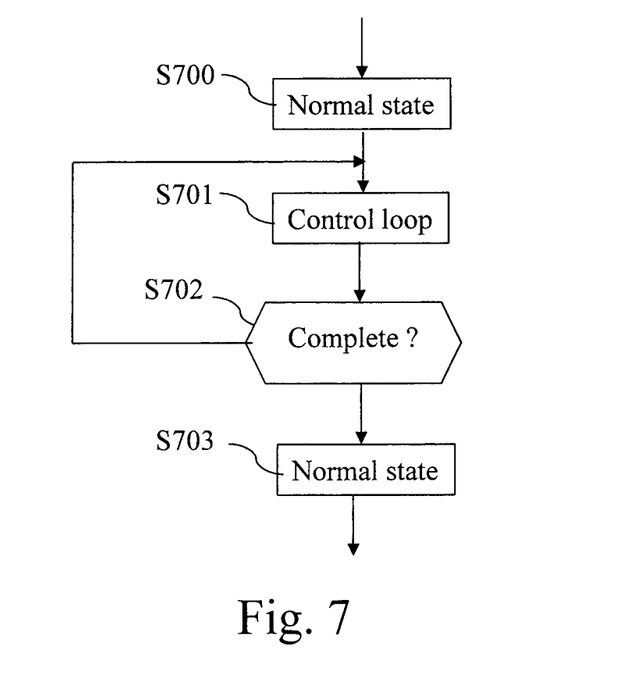
FIG. 7 represents an algorithm for controlling the healing process of at least one top connection of a power die.

The controller 10 has, for example, an architecture based on components connected together by a bus 601 and a processor 600 controlled by a program as disclosed in FIG. 7.

The bus 601 fill is the processor 600 to a read only memory ROM 602, a random access memory RAM 603 and an input output interface I/O IF 605.

The memory 603 contains registers intended to receive variables and the instructions of the program related to the algorithm as disclosed in FIG. 7.

The processor 600 receives through the input output I/O IF 605 the collector current Ic, the temperature sensed by a temperature sensor or a thermal sensitive parameter feedback, and controls the currents going through supplementary interconnections accordingly such as to control the power dissipation in the power module to a specific level to induce the healing state. Depending on the properties of the restoration material in the power module, the temperature might be required to be held constant, in which case, a thermocouple embedded onto the power module can be employed for regulation purposes or a thermal sensitive electrical parameter can be employed (eg. Vg for a certain current Ic).

The read-only memory, or possibly a Flash memory 602, contains instructions of the program related to the algorithm as disclosed in FIG. 7, when the controller 10 is powered on, to the random access memory 603.

The controller 10 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the controller 10 includes circuitry, or a device including circuitry, enabling the controller 10 to perform the program related to the algorithm as disclosed in FIG. 7.

FIG. 7 represents an algorithm for controlling the heating state of a solder layer in order to realize healing process according to the invention.

The present algorithm is disclosed in an example where it is executed by the processor 600 of the controller 10.

At step S700, the restoration process is disabled.

At next step S701, the processor 600 enables the high frequency current to go through the connections Cn21 and Cn22, or Extp41 and Extp42, or Extp51 and Extp52 and controls a heating state control loop.

The temperature is regulated during a given duration, for example at 150° C. for aluminium alloy bond wires, during 30 mn.

At step S702, the processor 600 checks if the given duration is completed. If the given duration is completed, the processor 600 moves to step S703. Otherwise, the processor 600 returns to step S701.

At step S703, the processor 600 disables the restoration process.

Naturally, many modifications can be made to the embodiments of the invention described above without departing from the scope of the present invention.

The invention claimed is:

1. A system for allowing the restoration of a first interconnection of a die of a power module connecting the die to an electric circuit, characterized in that the system comprises:
    at least one other interconnection of the power module,
    a periodic current source that is connected to the at least one other interconnection for generating a high frequency periodic current flow through the at least one other interconnection in order to reach, in at least a part of the first interconnection, a predetermined temperature during a predetermined time duration in order to allow the restoration of the first interconnection by increasing the first interconnection temperature and by increasing the pressure along crack in the first interconnection and thereby increasing a rate of diffusion in cracks causing the crack to heal and wherein the interconnections are bond wires or the interconnections are copper vias, the periodic current source is connected to two other interconnections and the power module further comprises one induction coil that is connected to the two interconnections in order to reach, in at least a part of the first interconnection, the predetermined temperature during the predetermined time duration or the power module further comprises one magnetic structure that is connected to the two interconnections in order to reach, in at least a part of the first interconnection, the predetermined temperature during the predetermined time duration.

2. The system according to claim 1, wherein a first terminal of the first interconnection is connected to a metallization of the die, a first terminal of the at least one second interconnection is connected to the first terminal of the first interconnection and the periodic current source is connected to a second terminal of the first interconnection and to a second terminal of the at least one second interconnection for generating a periodic current flow through the interconnections and the metallization.

3. The system according to claim 1, wherein the bond wires are aluminium alloy bond wires.

4. The system according to claim 2, wherein the periodic current source is a square or sine wave signal of a frequency upper than 100 KHz and an RMS value of 82 A to 108Amperes.

5. The system according to claim 3, wherein the periodic current source is a square or sine wave signal of a frequency upper than 100 KHz and an RMS value of 82 A to 108 Amperes.

6. The system according to claim 2, wherein the predetermined temperature is between 150 to 200° C. and the predetermined time duration is between 50 to 100 hours.

7. The system according to claim 3, wherein the predetermined temperature is between 150 to 200° C. and the predetermined time duration is between 50 to 100 hours.

8. The system according to claim 4, wherein the predetermined temperature is between 150 to 200° C. and the predetermined time duration is between 50 to 100 hours.

9. The system according to claim 5, wherein the predetermined temperature is between 150 to 200° C. and the predetermined time duration is between 50 to 100 hours.

10. A method for allowing the restoration of a first interconnection of a die of a power module connecting the die to an electric circuit, characterized in that the method comprises the steps of:

providing a high frequency periodic current source to at least one other interconnection of the power module for generating a periodic current flow through the at least one other interconnection in order to reach, in at least a part of the first interconnection, a predetermined temperature, controlling the periodic current flow at the predetermined temperature during a predetermined time duration in order to allow the restoration of the first interconnection by increasing the first interconnection temperature and by increasing the pressure along crack in the first interconnection and thereby increasing a rate of diffusion in cracks causing the crack to heal and wherein that the interconnections are bond wires or the interconnections are copper vias, the periodic current source is connected to two other interconnections and the power module further comprises one induction coil that is connected to the two interconnections in order to reach, in at least a part of the first interconnection, the predetermined temperature during the predetermined time duration or the power module further comprises one magnetic structure that is connected to the two interconnections in order to reach, in at least a part of the first interconnection, the predetermined temperature during the predetermined time duration.

* * * * *